United States Patent
Tihanyi

(10) Patent No.: US 6,617,640 B2
(45) Date of Patent: Sep. 9, 2003

(54) FIELD-EFFECT-CONTROLLABLE SEMICONDUCTOR CONFIGURATION WITH A LATERALLY EXTENDING CHANNEL ZONE

(75) Inventor: Jenoe Tihanyi, Kirchheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/815,657

(22) Filed: Mar. 23, 2001

(65) Prior Publication Data

US 2001/0025983 A1 Oct. 4, 2001

(30) Foreign Application Priority Data

Mar. 23, 2000 (DE) .......................................... 100 14 384

(51) Int. Cl.[7] ............................................... H01L 29/76
(52) U.S. Cl. ........................ 257/330; 257/403; 257/408
(58) Field of Search ................................. 257/330, 403, 257/408

(56) References Cited

U.S. PATENT DOCUMENTS 3,296,462 A * 1/1967 Reddi .......................... 257/403
5,844,273 A 12/1998 Konishi
6,097,061 A * 8/2000 Liu et al. ..................... 257/330

OTHER PUBLICATIONS

B. Jayant Baliga et al.: "The Accumulation–Mode Field–Effect Transistor: A New Ultralow On–Resistance MOSFET", *IEEE Electron Device Letters*, vol. 13 No. 8, Aug. 1992, pp. 427, 428.

* cited by examiner

*Primary Examiner*—Mark V. Prenty
(74) *Attorney, Agent, or Firm*—Laurence A. Greenberg; Werner H. Stemer; Gregory L. Mayback

(57) ABSTRACT

A semiconductor configuration includes a semiconductor body with a first connection zone of a first conductivity type, a second connection zone of the first conductivity type, a channel zone of the first conductivity type, and at least one control electrode surrounded by an insulation layer. The channel zone is formed between the first connection zone and the second connection zone. The at least one control electrode extends, adjacent to the channel zone, from the first connection zone to the second connection zone. The first connection zone, the second connection zone and the at least one control electrode extend in the vertical direction such that, when a voltage is applied between the first and second connection zones, a current path along the lateral direction is formed in the channel zone.

15 Claims, 6 Drawing Sheets

FIELD-EFFECT-CONTROLLABLE SEMICONDUCTOR CONFIGURATION WITH A LATERALLY EXTENDING CHANNEL ZONE

BACKGROUND OF THE INVENTION

Field of the Invention

The invention relates to a semiconductor configuration having a semiconductor body with connection zones, a channel zone and a control electrode surrounded by an insulating layer.

Such semiconductor configurations with first and second connection zones and a channel zone of the same conductivity type are, for example, "ACCUFETs" (Accumulation-Mode Field-Effect Transistors), as are described in the article "The Accumulation-Mode-Field-Effect-Transistor; A new ultralow on-resistance MOSFET" by B. Jayant Baliga, IEEE ELECTRON DEVICE LETTERS, Vol. 13, No. 8, August 1992.

U.S. Pat. No. 5,844,273 describes such an ACCUFET having an n-doped drain zone as a first connection zone, the drain zone being provided in the region of a rear side of a semiconductor body, an n-doped source zone as a second connection zone, the source zone being provided in the region of a front side of the semiconductioe body, and a weakly n-doped channel zone formed between the source zone and the drain zone. A gate electrode as a control electrode of the ACCUFET extends in the vertical direction of the semiconductor body adjacently to opposite sides of the weakly n-doped channel zone between the source zone and the drain zone. When a voltage is applied between the drain zone and the source zone, a current flows in the vertical direction of the semiconductor body in the channel zone. When a negative drive potential is applied to the gate electrode, a conducting channel in the channel zone between the drain and source zones is pinched off and the ACCUFET turns off. What is crucial for the dielectric strength of such an ACCUFET is, inter alia, the thickness of an insulation layer surrounding the gate electrode. In the ACCUFET in accordance with the above-mentioned U.S. Pat. No. 5,844,273, the drain zone has, beside a heavily n-doped region, a more weakly n-doped region adjoining the channel zone and the gate electrode. The distance—determined by the more weakly doped region of the drain zone—between the channel zone, or the gate electrode, and the more heavily doped region of the drain zone determines, inter alia, the dielectric strength of the device.

As a result, with regard to the dielectric strength, in the known ACCUFET the minimum height thereof in the vertical direction of the semiconductor body is determined by the dimensions of the gate electrode in the vertical direction of the semiconductor body, and if appropriate the dimensions of the more weakly doped region of the drain zone in the vertical direction. In the known ACCUFET, the heavily doped region of the drain zone, which reaches from a rear side of the semiconductor body up to the channel zone, or the more weakly doped region of the drain zone, takes up a considerable space of the semiconductor body. Its dimensions in the vertical direction are thus determined by the dimensions of the semiconductor body in the vertical direction minus the dimensions of the gate electrode and the dimensions—prescribed by the desired dielectric strength— in the vertical direction of the more weakly doped region of the drain zone. A significantly smaller "height" of the drain zone, or of the heavily doped region thereof, would suffice in many cases for a reliable functioning of the ACCUFET. In the known components, the drain zone thus takes up a considerable bulk proportion of the available semiconductor body which remains substantially unutilized.

SUMMARY OF THE INVENTION

It is accordingly an object of the invention to provide a semiconductor configuration which overcomes the above-mentioned disadvantages of the heretofore-known configurations of this general type and which achieves a higher packing density, that is to say more field-effect-controllable components with first and second connection zones and channel zones of the same conductivity type and control electrodes for driving can be accommodated in the semiconductor body. In this context, "more components" also means more identically constructed cells of a component whose respective connection zones and channel zones are jointly interconnected.

With the foregoing and other objects in view there is provided, in accordance with the invention, a semiconductor configuration, including:

a semiconductor body including a first connection zone of a first conductivity type, a second connection zone of the first conductivity type, a channel zone of the first conductivity type, at least one control electrode, and an insulation layer;

the channel zone of the first conductivity type being formed between the first connection zone and the second connection zone;

the insulation layer surrounding the at least one control electrode;

the at least one control electrode extending, adjacent to the channel zone, from the first connection zone to the second connection zone;

the semiconductor body defining a vertical direction and a lateral direction; and the first connection zone, the second connection zone and the at least one control electrode extending in the vertical direction such that, when a voltage is applied between the first and second connection zones, a current path along the lateral direction is formed in the channel zone.

In other words, the object of the invention is achieved when the first connection zone, the second connection zone and the control electrode extend in the vertical direction of the semiconductor body in such a way that when a voltage is applied between the first and second connection zones, a current path is formed in the lateral direction of the semiconductor body in the channel zone.

The properties of the semiconductor configuration according to the invention, in particular with regard to its dielectric strength, are determined, inter alia, by the thickness of the insulation layer of the control electrode, the length of the channel zone in the lateral direction of the semiconductor body and, if appropriate, the dimensions of a more weakly doped region of the first connection zone between the channel zone and a more heavily doped region of the first connection zone.

The dimensions of the cross section of the channel zone transversely with respect to the current direction influence the conductivity of the component formed in the semiconductor configuration according to the invention. In the configuration according to the invention, the first and second connection zones, the channel zone and the control electrode can extend into the semiconductor body virtually as far as desired—only limited by the height of the semiconductor body—in the vertical direction of the semiconductor body. This makes it possible to enlarge the cross section of the channel zone without influencing the dielectric strength of the component formed in the semiconductor configuration according to the invention, the dielectric strength being influenced by the dimensions of the component in the local direction. A larger part of the semiconductor body can be utilized as channel zone in the semiconductor configuration according to the invention than according to the prior art.

The control electrode is preferably in the form of a plate, its longitudinal extent in a first lateral direction of the semiconductor body and in the vertical direction of the semiconductor body being significantly greater than in a second lateral direction of the semiconductor body transversely with respect to the first lateral direction. The control electrode configured in the form of a plate along the channel zone, or on both sides of the channel zone, requires less space in the semiconductor body and so the packing density that can be achieved is additionally increased, that is to say that the number of field-effect-controllable components that can be realized in a predetermined semiconductor body increases.

Preferably, the first connection zone, the second connection zone, the channel zone and the control electrode extend from a front side of the semiconductor body in the vertical direction thereof approximately up to the rear side thereof in order that the semiconductor body is virtually completely utilized for a controllable component.

A further embodiment provides for a control electrode to be shared in each case by two first connection zones, the control electrode extending from one of the two first connection zones to the other of the two first connection zones adjacently to the second connection zone and the channel zone. This measure additionally contributes to a space gain and increases the number of components, or cells of a component, which can be accommodated in the semiconductor body.

Preferably, contact can be made with the second connection zone from a front side of the semiconductor body, and with the first connection zone from a rear side of the semiconductor body. In an embodiment having a plurality of identically constructed cells, in order to make contact with the first connection zones of the individual cells, a doped layer of the first conductivity type is provided in the region of the rear side of the semiconductor body, the dopant concentration of which layer preferably corresponds to the dopant concentration of the first connection zones, and which layer is connected to the first connection zones extending vertically. A metal layer is preferably applied to this layer provided on the rear side, which metal layer can be connected to a supply potential for the first connection zone.

A further embodiment provides for regions made of a readily electrically conductive material, preferably made of polysilicon or a metal, to be introduced into the vertically extending first connection zones and the vertically extending second connection zones. These readily electrically conductive regions, which are preferably connected to respective supply potentials for the first and second connection zones, have the effect that the respective potential is approximately constant in the vertical direction of the first and second connection zones.

According to another feature of the invention, the first connection zone and the second connection zone define the lateral direction as extending from the first connection zone to the second connection zone; the first and/or second connection zone has a first dimension in the vertical direction and a second dimension in the lateral direction; and the first dimension is smaller than the second dimension.

According to yet another feature of the invention, the lateral direction is a first lateral direction extending from the first connection zone to the second connection zone; the semiconductor body defines a second lateral direction transverse to the first lateral direction; the at least one control electrode is a substantially plate-shaped control electrode having a respective longitudinal extent in the vertical direction and in the first lateral direction and a lateral extent in the second lateral direction; and the respective longitudinal extent is greater than the lateral extent.

According to another feature of the invention, the first connection zone has a first zone with a first dopant concentration and a second zone with a second dopant concentration; the first dopant concentration is higher than the second dopant concentration; and the second zone is formed between the first zone and the channel zone.

According to a further feature of the invention, the first connection zone has a first zone with a first dopant concentration and a second zone with a second dopant concentration; and the second zone completely surrounds the first zone in the lateral direction.

According to another feature of the invention, the first connection zone has a first zone with a first dopant concentration and a second zone with a second dopant concentration; the second connection zone has a third dopant concentration; the channel zone has a fourth dopant concentration; and the fourth dopant concentration is lower than the first and third dopant concentrations.

According to a further feature of the invention, the semiconductor body has a rear side; a layer of the first conductivity type is disposed at the rear side; the first connection zone has a first zone with a first dopant concentration and a second zone with a second dopant concentration; the layer has a fifth dopant concentration; the fifth dopant concentration substantially corresponds to the first dopant concentration; and the layer is connected to the first connection zone.

According to another feature of the invention, a further first connection zone is provided; a further channel zone extends between the further first connection zone and the second connection zone; and the at least one control electrode extends, adjacent to the second connection zone, the channel zone and the further channel zone, from the first connection zone to the further first connection zone.

According to another feature of the invention, the semiconductor body has a front side and a rear side; and the first connection zone extends, in the vertical direction, from the front side to the rear side of the semiconductor body.

According to another feature of the invention, the semiconductor body has a rear side; and an electrically conductive layer is disposed on the rear side of the semiconductor body for making contact with the first connection zone.

According to yet another feature of the invention, an electrically conductive zone is introduced in the first and/or second connection zone for making contact with the first and/or second connection zone.

According to another feature of the invention, the electrically conductive zone is formed of polysilicon or a metal.

According to another feature of the invention, the first dopant concentration is higher than $10^{18}$ cm$^{-3}$.

According to a further feature of the invention, the second dopant concentration is about $5 \times 10^{15}$ cm$^{-3}$.

According to another feature of the invention, the fourth dopant concentration is less than $10^{14}$ cm$^{-3}$.

Other features which are considered as characteristic for the invention are set forth in the appended claims.

Although the invention is illustrated and described herein as embodied in a field-effect-controllable semiconductor configuration with a channel zone running laterally, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Unless specified otherwise, identical reference symbols designate identical parts and corresponding regions in the figures.

The invention is explained in more detail below with reference to an ACCUFET. In this case, a drain zone corresponds to the first connection zone, a source zone corresponds to the second connection zone and a gate electrode corresponds to the control electrode. The explanation, which is given with reference to an n-conducting semiconductor body, applies correspondingly to a p-conducting semiconductor body.

Figure 1A:
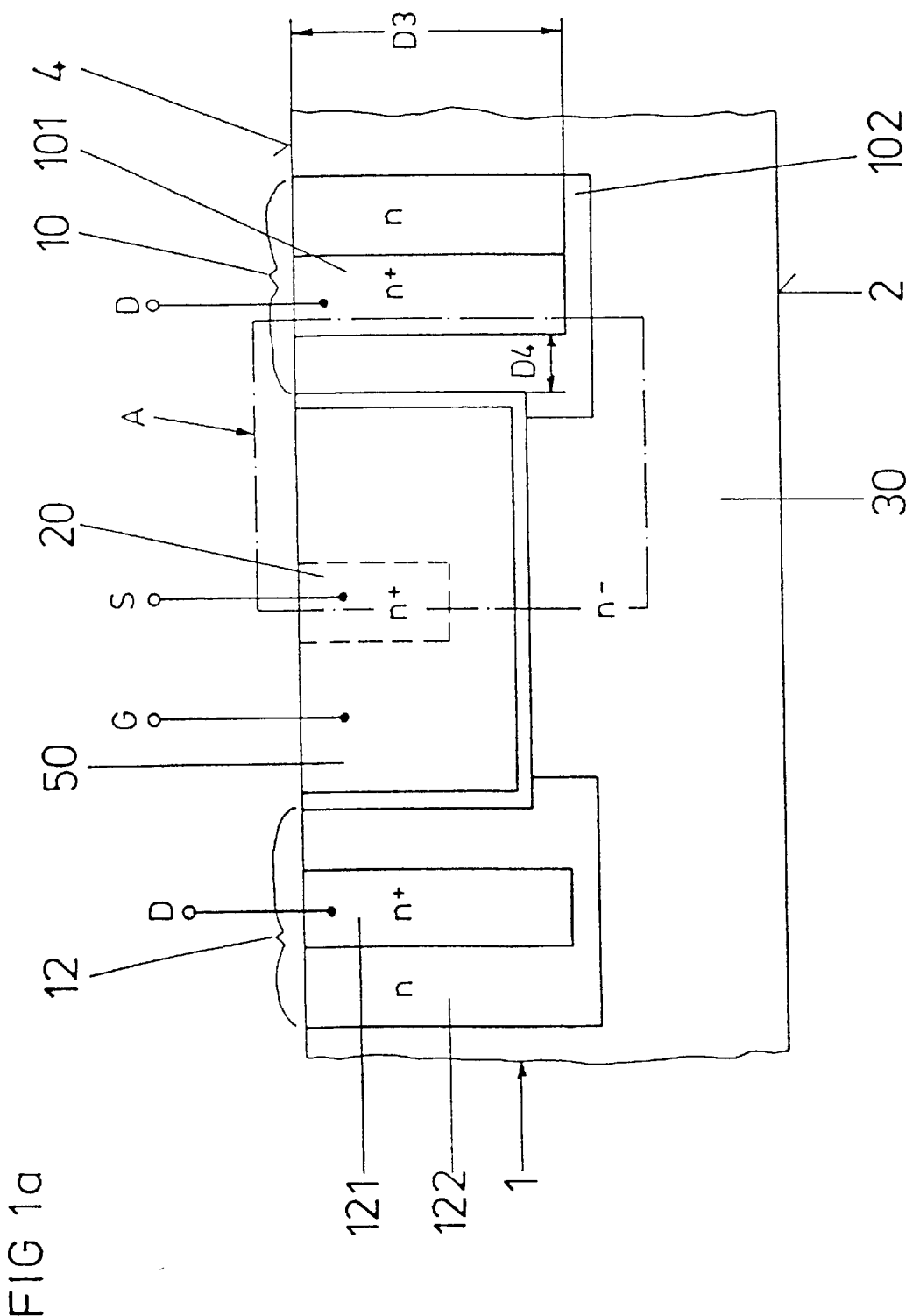
FIG. 1a is a diagrammatic, lateral, partial sectional view of a first embodiment of a semiconductor configuration according to the invention.
Figure 1B:
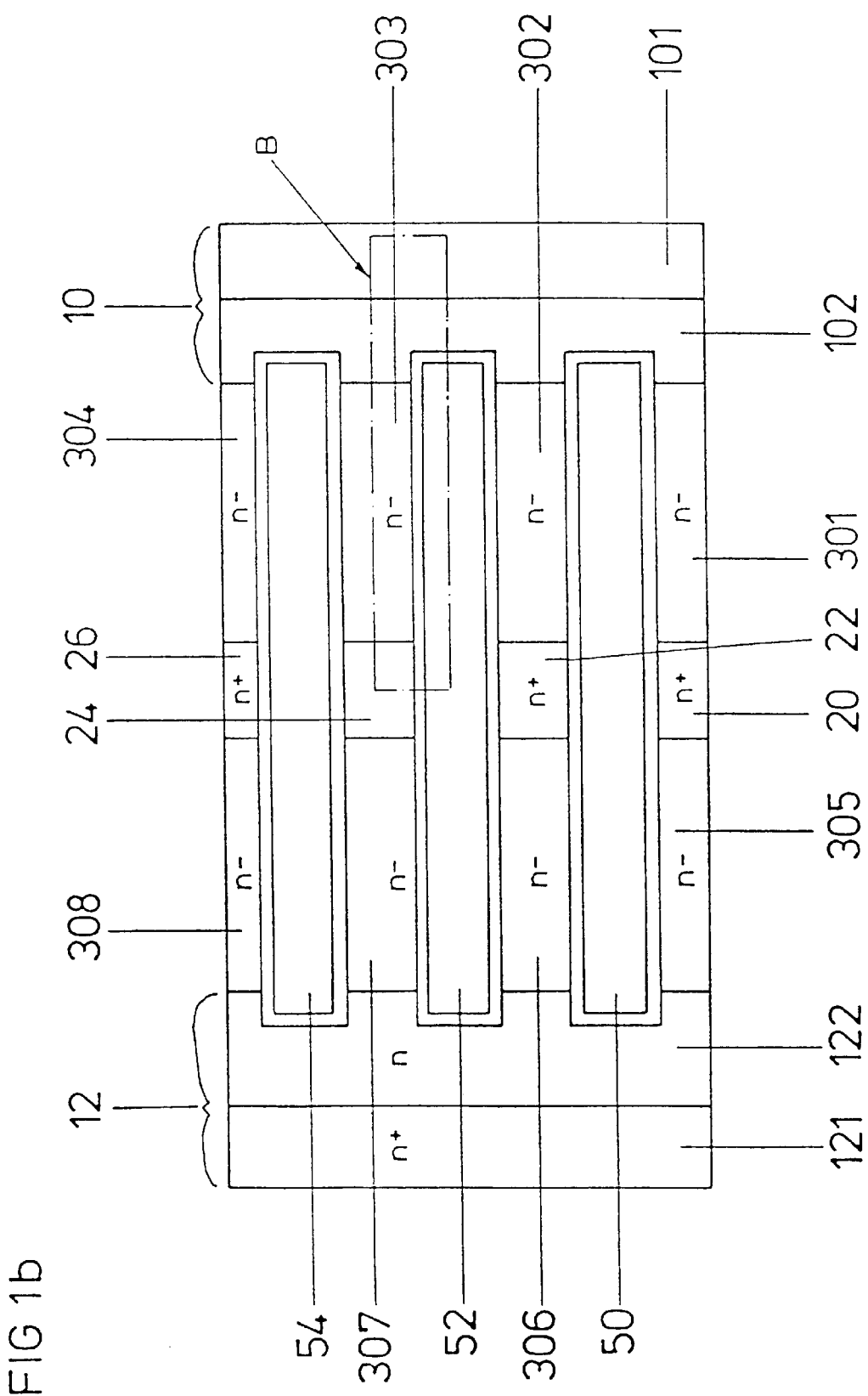
FIG. 1b is a diagrammatic plan view of the first embodiment of the semiconductor configuration according to the invention.

FIG. 1a shows a detail of a semiconductor configuration according to the invention in a lateral sectional illustration. A plan view of the detail according to FIG. 1a is illustrated in FIG. 1b. Furthermore, FIG. 1c shows, in a perspective illustration, the portion A depicted by dash-dotted lines in FIG. 1a.

The semiconductor configuration according to the invention has a semiconductor body 1—n-doped in the present case—in which regions doped to different extents are formed. In order to form an ACCUFET, the semiconductor body has at least one heavily n-doped drain zone 10, 12, at least one heavily n-doped source zone 20, 22, 24, 26 and weakly doped channel zones 301, 302, 303, 304, 305, 306, 307, 308 formed between the source and drain zones. The channel zones 301–308 in FIG. 1 are the portions—located between the source and drain zones 20, 22, 24, 26; 10, 12—of a weakly doped region 30 of the semiconductor body 1 which surrounds the source and drain zones 20–26; 10, 12.

A respective gate electrode 50, 52, 54 is provided adjacent to the channel zone 301–308 formed between the source zone 20, 22, 24, 26 and the drain zone 10, 12, which gate electrode is insulated from the semiconductor body 1 through the use of an insulation layer 40, 42, 44.

Figure 1C:
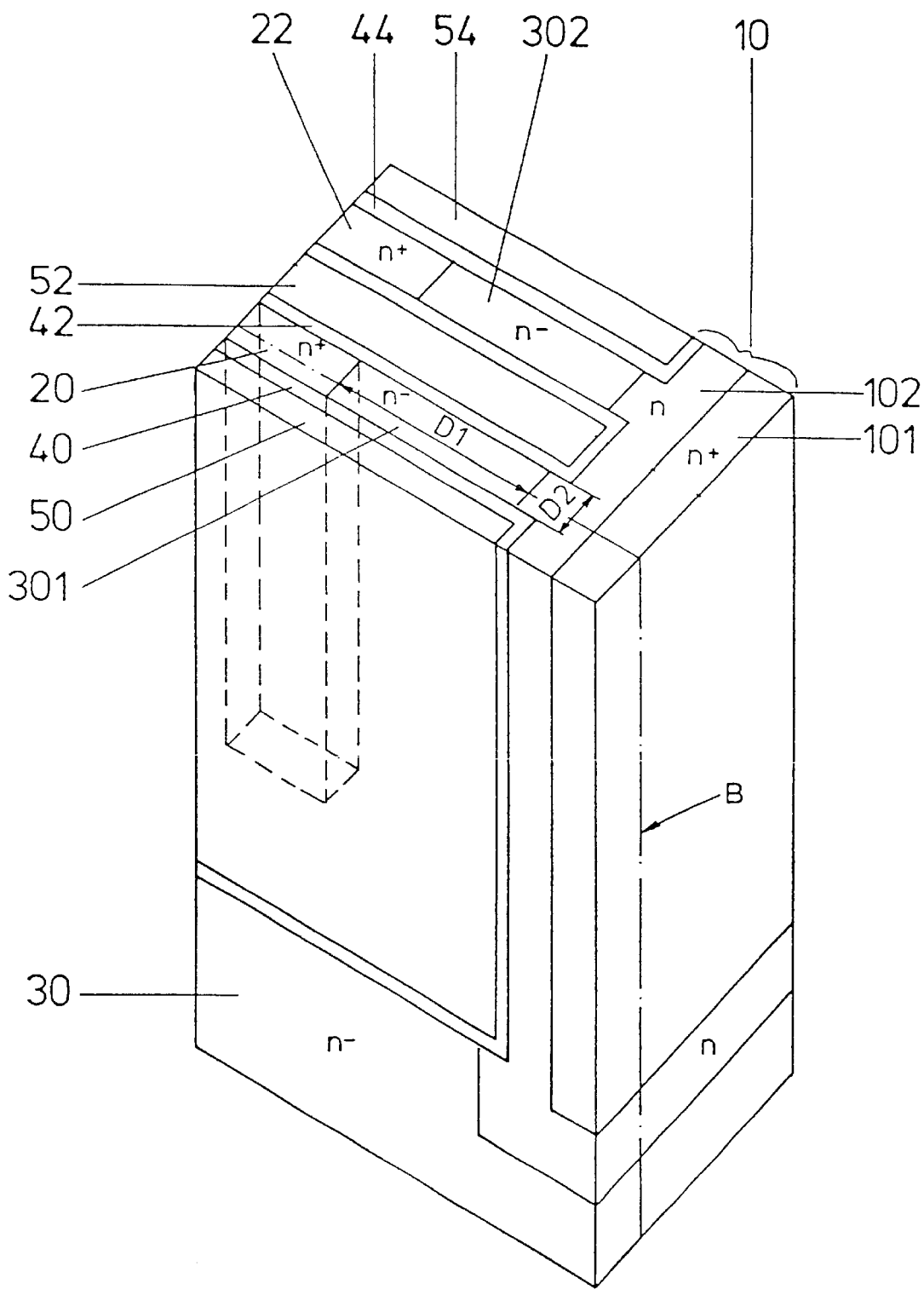
FIG. 1c is a diagrammatic, perspective sectional view of the first embodiment of the semiconductor configuration according to the invention.

The configuration according to FIG. 1 shows an ACCUFET having a number of identically constructed cells each having a drain zone 10, 12 and a source zone 20–26 with a channel zone 301–308 formed in between. In this case, each of the cells functions like an ACCUFET and has a field-effect-controllable channel in the respective channel zone 301–308, in which case, as the number of such cells rises, the channel which can be controlled in the ACCUFET is enlarged and, as a result, its ability to take up large currents increases. The dash-dotted line B in FIG. 1b shows the contour of a cell in plan view. The dash-dotted line B in FIG. 1c likewise illustrates the dimensions of a cell in perspective view. For space reasons, the gate electrodes 50, 52, 54, 58, the drain zones 10, 12, the channel zones 301–308 and the source zones 20–26 are shared by a plurality of cells. As can best be seen from the plan view in FIG. 1b, a gate electrode 50, 52, 54 is shared in each case by four cells, and a channel zone 301–308 and a source zone 20, 22, 24, 26 are shared in each case by two cells. The drain zones 10, 12 are shared in each case by six cells in the detail portrayed. FIG. 1b shows only a detail; the structure illustrated in FIG. 1b is actually repeated to the left, to the right, upward and downward.

According to the invention, the source zones 20, 22, 24, 26 and the drain zones 10, 12 extend into the semiconductor body in the vertical direction proceeding from a front side 4 of the semiconductor body 1, the dimensions of the source zones 20–26 and of the drain zones 10, 12 in a lateral direction of the semiconductor body 1 being small compared with their extent in the vertical direction of the semiconductor body 1. In the exemplary embodiment, the gate electrodes 50, 52, 54 are configured in plate form and likewise extend into the semiconductor body 1 essentially in the vertical direction proceeding from the front side 4 of the semiconductor body 1, the dimension of the gate electrodes 50, 52, 54, 58 in the vertical direction of the semiconductor body 1 and in a first lateral direction of the semiconductor body 1, the lateral direction running from the drain zones 10, 12 to the source zones 20, 22, 24, 26, being large relative to the extent in a second lateral direction of the semiconductor body 1 transversely with respect to the first lateral direction.

In the exemplary embodiment, the gate electrodes 50, 52, 54, 58 each extend from a first drain zone 10 to a second drain zone 12, the source zones 20, 22, 24, 26 being provided between the gate electrodes 50, 52, 54 and the channel zones 301–308 being formed between the gate electrodes 50, 52, 54.

The drain zones 10, 12 are connected to a common drain potential via drain connections D, whose structural configuration is not illustrated in specific detail in FIG. 1a for reasons of clarity. Likewise, the source zones 20 to 26 are connected to a source potential via source connections S, whose structural configuration is not illustrated in specific detail. Moreover, the gate electrodes are connected to a common gate potential via gate connections G, whose structural configuration is not illustrated.

When a voltage is applied between the drain zones 10, 12 and the source zones 20, 22, 24, 26 a current flows in the lateral direction of the semiconductor body in the channel zones between the drain and source zones 10, 12; 20, 22, 24, 26. When a negative potential is applied to the gate electrodes 50, 52, 54, the current path in the channel zones 301–308 is pinched off and the ACCUFET turns off. As is made clear in FIGS. 1a and 1c by the contour of one of the source zones 20 which is depicted by dashed lines, the source zones 20–26 do not reach into the depth of the semiconductor body 1 in the vertical direction to the same extent as the gate electrodes 50, 52, 54, in order to ensure that the blocking region formed when the negative potential is applied completely surrounds the source zone 20, 22, 24, 26 and the ACCUFET reliably turns off.

An important property of the ACCUFET is its dielectric strength, which is determined, inter alia, by the length of the channel zones 301–308 between the source zones 20–26 and the drain zones 10, 12 and the thickness of the insulation layer 40–44 surrounding the gate electrodes 50–54. In the ACCUFET as shown in FIG. 1, the dielectric strength is increased by the drain zones 10, 12 having, beside heavily n-doped regions 10A, 101, 121, more weakly n-doped regions 12B, 102, 122 provided between the channel zones 301–308 and the heavily doped regions 10A, 101, 121 of the drain zones 10, 12. In this case, the dielectric strength of the ACCUFET is influenced by the dimensions of the more weakly doped regions 12B, 102, 122 in the lateral direction of the semiconductor body 1 between the source zones 20–26 and the heavily doped regions 10A, 101, 121 of the drain zones 10, 12.

The dimensioning of the channel zones 301–308, of the gate electrodes 50, 52, 54, of the drain zones 10, 12 and of the source zones 20, 26 in the vertical direction of the semiconductor body 1 has no effects on the dielectric strength of the ACCUFET, but does influence the ability of the ACCUFET to take up current. The larger the channel cross-section, the better the ACCUFET turns on, or the more current it can take up. The semiconductor configuration according to the invention makes it possible to increase the cross section of the channel zone 301–308 by virtue of the fact that the channel zone 301–308 descends between the gate electrodes 52, 54, 56 in the vertical direction of the semiconductor body 1 and that the drain and source zones 10, 12, 20–26 extend into the semiconductor body 1 likewise in the vertical direction along the channel zone in order to enable a current flow from the drain zones 10, 12 to the source zones 20–26 over the entire cross section of the channel zone 301–308.

As a result, the invention's configuration of the ACCUFET makes it possible for the semiconductor body 1 to be approximately completely utilized in the vertical direction. This entails the advantage that, compared with the prior art, fewer cells are necessary in order to obtain a desired conductivity of the ACCUFET, or that more cells of an ACCUFET can be accommodated in a predetermined semiconductor body. Distances D1, D2, D3 and D4 are depicted in FIG. 1, which distances shall be used to elucidate an exemplary dimensioning of the ACCUFET according to the invention. D1 designates the dimension of the channel zones 301–308 in the lateral direction of the semiconductor body between the drain zone 10 and the source zone 20, this distance preferably being about 2 to 3 $\mu$m. D2 denotes the thickness of the channel zone 301–308 between the gate electrodes 50 to 54 or the insulation layers 40 to 44 of the gate electrodes 50 to 54. The distance D2 is preferably between 0.5 $\mu$m and 1.0 $\mu$m. The thickness of the insulation layers 40–44, which are preferably composed of a semiconductor oxide, is in the nanometer range. D3 denotes the extent of the drain zone 10, 12 in the vertical direction, which is preferably 20 to 50 $\mu$m. The distance D4 between the gate electrode 50 and the heavily doped region 101 of the drain zone 10, which distance is crucial for the dielectric strength, inter alia, is preferably about 5 $\mu$m or more. With a distance of 5 $\mu$m, for instance, a dielectric strength of 50V can be achieved.

The heavily doped region 10A, 12A of the drain zone 10, 12, has a first dopant concentration, which is preferably more than $10^{18}$ cm$^{-3}$. A fourth dopant concentration of the more weakly doped region 102, 122, 12B of the drain zone 10, 12 is preferably about $5 \times 10^{15}$ cm$^{-3}$. The source zone 20–26 has a third dopant concentration, which preferably likewise lies in the range of the first dopant concentration of the drain zone 10A, 101, 121. A third dopant concentration of the blocking region 30 is preferably less than $10^{14}$ cm$^{-3}$.

Figure 2:
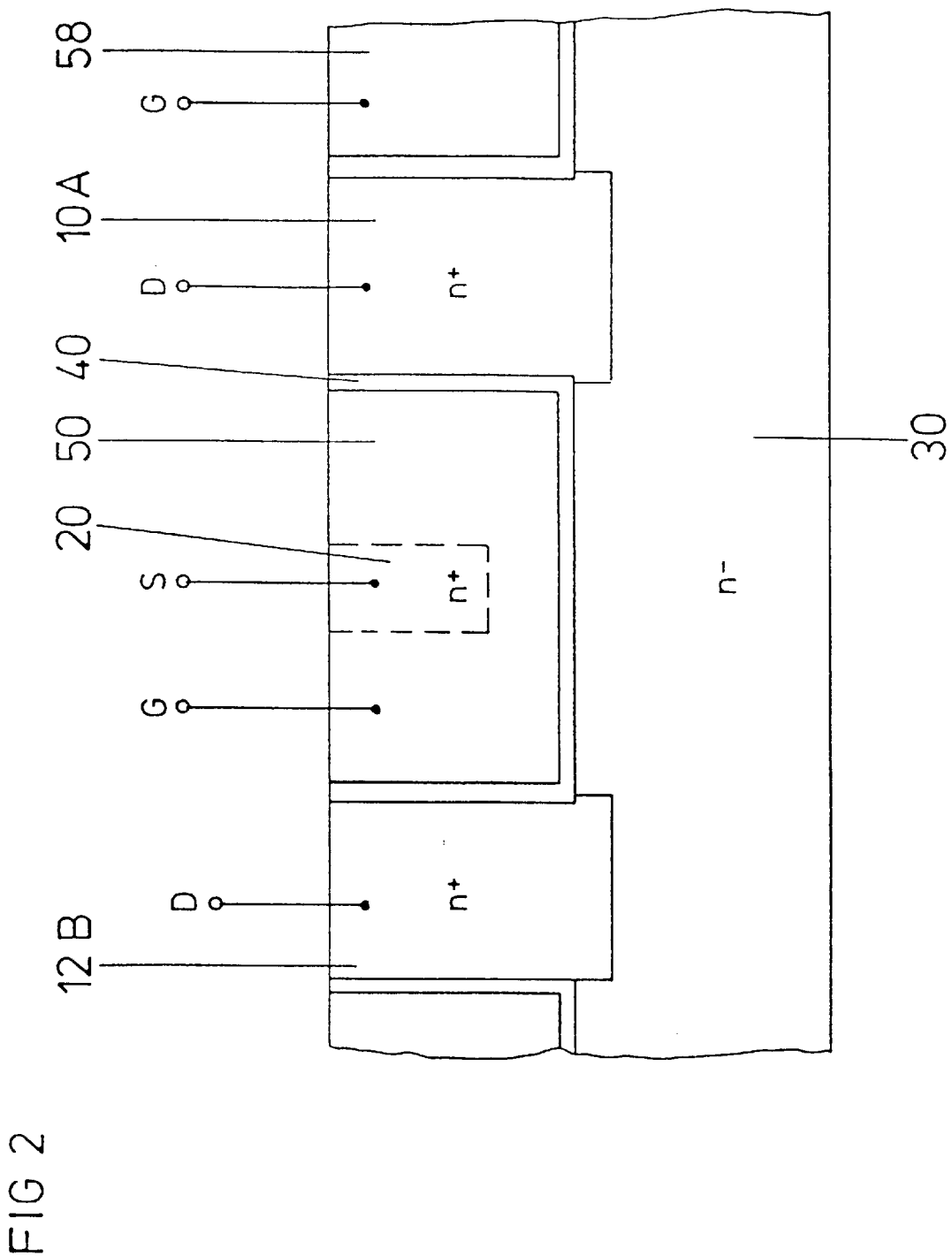
FIG. 2 is a diagrammatic, lateral, partial sectional view of a second embodiment of a semiconductor configuration according to the invention.

FIG. 2 shows a second embodiment of the semiconductor configuration according to the invention, in which the drain zones merely have a heavily doped region 10A, 101, 121. It becomes clear from FIG. 2 that the drain zones 10A, 101, 121 can be adjoined on both sides by gate electrodes 50, 58, which contributes to increasing the packing density in the semiconductor body.

FIG. 1 shows a substantially weakly doped (n-doped) semiconductor body into which the source zones 20–26 and the drain zones 10, 12 are introduced. The portions of the semiconductor body which are situated between the gate electrodes 50–54 or the source zones 20–26 and the drain zones 10, 12 in this case form the channel zones 301–308 of the ACCUFET or of the individual cells of the ACCUFET.

Figure 3:
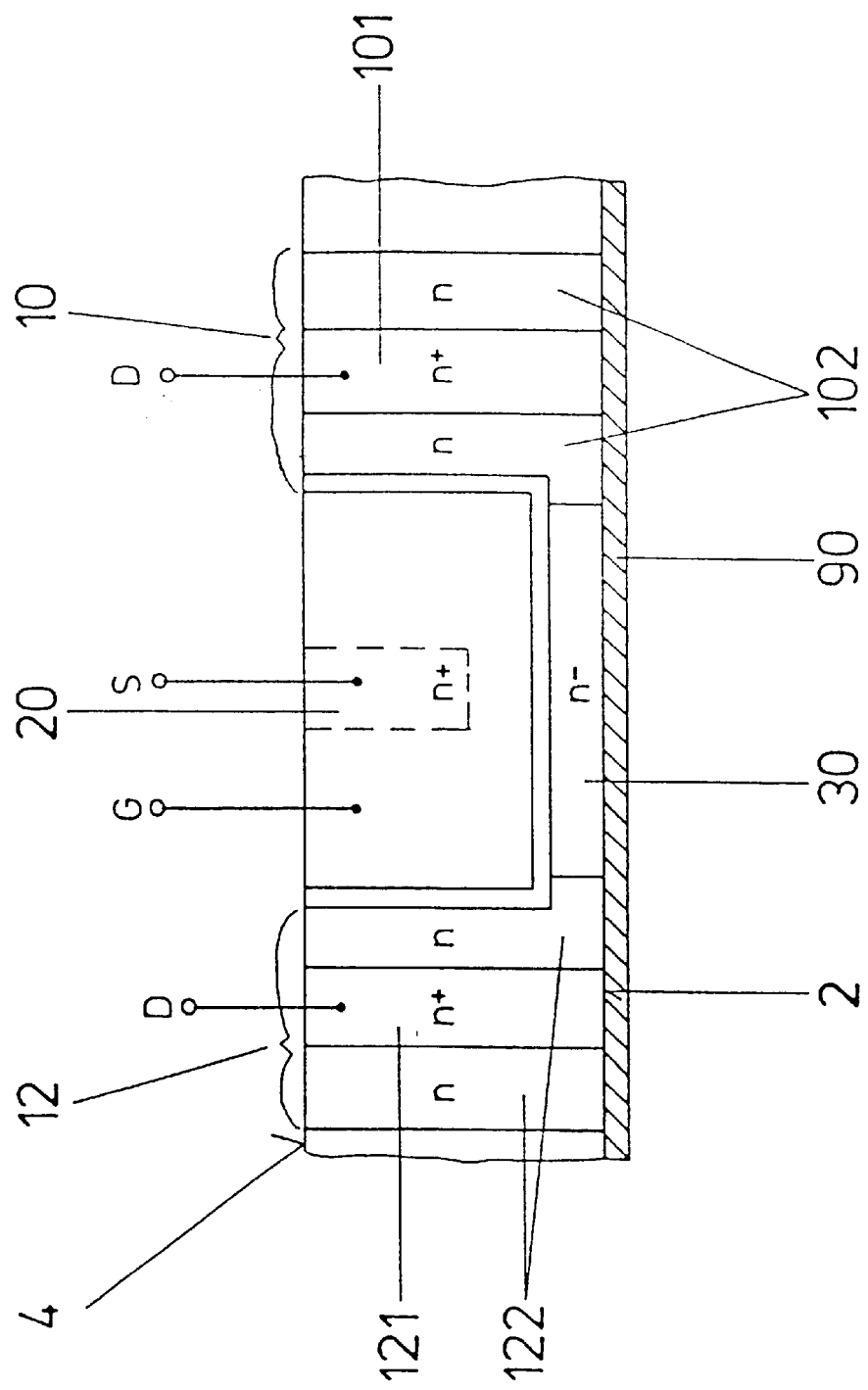
FIG. 3 is a diagrammatic, lateral, partial sectional view of a third embodiment of a semiconductor configuration according to the invention.

In the exemplary embodiment illustrated in FIG. 3, the drain zones 10, 12 extend from the front side 4 of the semiconductor body 1 in the vertical direction up to the rear side 2 of the semiconductor body 1, in order that the height of the semiconductor body 1 can be virtually completely utilized for the ACCUFET. The gate electrode 50 extends virtually up to the rear side 4 of the semiconductor body 1, and the same applies to the source zone 20. The weakly doped region 30 formed between the drain zones 10, 12, the source zone 20 and the gate electrodes 50 forms the channel zone of the ACCUFET. A contact layer 90 for applying a drain potential to the drain zone 10, 12 is applied to the rear side 4 of the semiconductor body 1. This embodiment enables contact to be made with the source zone 20 via a source electrode S, the structural configuration of which is not illustrated in specific detail, and with the gate electrode 50 via a gate connection G, which is not illustrated in specific detail, via the front side 2 of the semiconductor body 1, and enables the connection of the drain zone 10, 12 via the rear side 4 of the semiconductor body 1.

Figure 4:
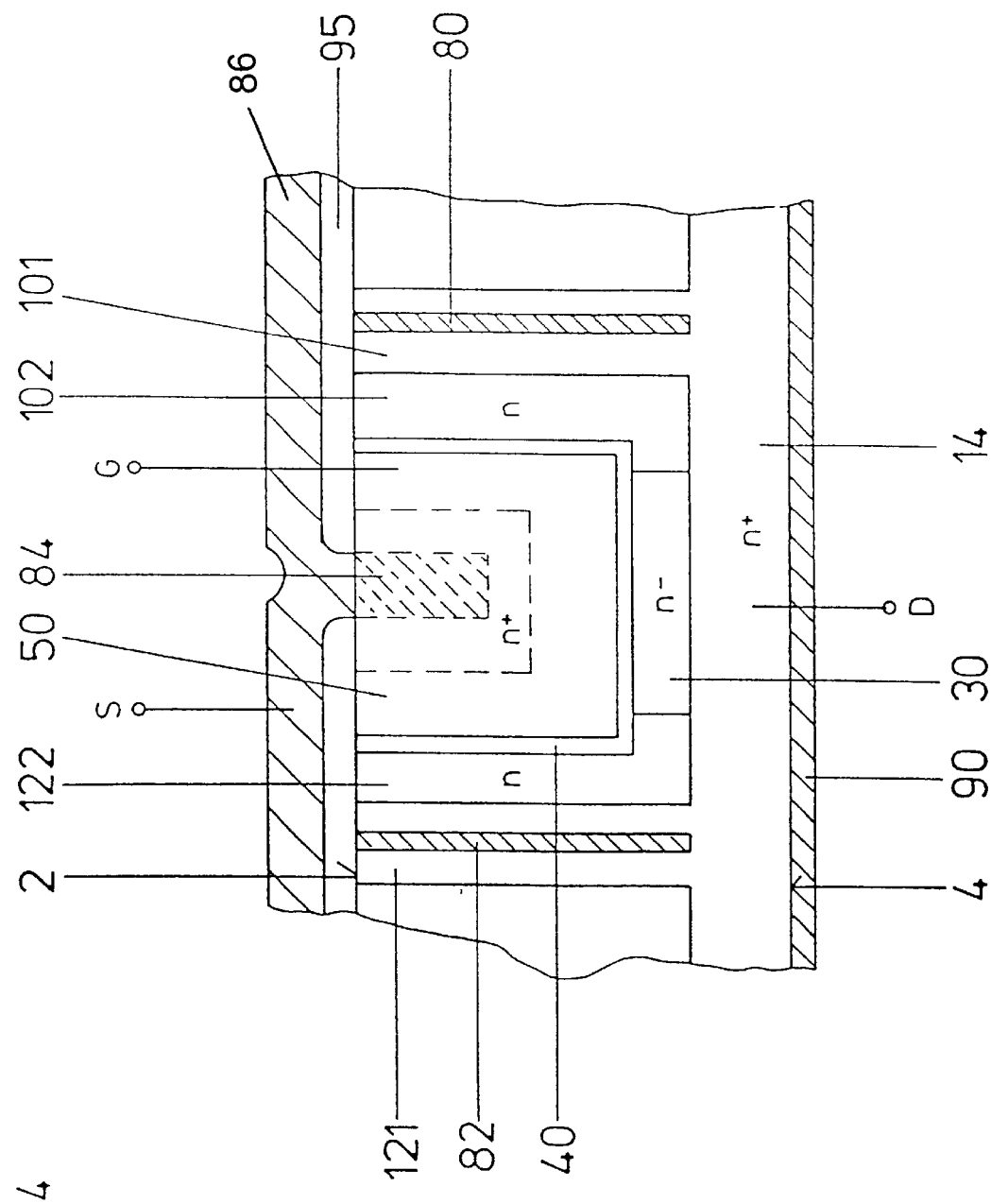
FIG. 4 is a diagrammatic, lateral, partial sectional view of a fourth embodiment of a semiconductor configuration according to the invention.

FIG. 4 shows a further embodiment of the semiconductor configuration according to the invention. In this semiconductor configuration, firstly a heavily doped layer 14 is provided in the region of the rear side 2 of the semiconductor body 1, the dopant concentration of the layer 14 preferably corresponding to the dopant concentration of the drain zones 10, 12 and the layer 14 being connected to the drain zones 10, 12. A contact layer 90, preferably made of metal, is applied to the layer 14, via which contact layer the drain zones 10, 12 can be put at a drain potential applied to the contact layer 90. Furthermore, regions 80, 82 made of a readily electrically conductive material, preferably a metal or a polysilicon, are introduced into the drain zones 10, 12, these readily conductive regions 80, 82 having the effect that the drain potential is at least approximately constant in the drain zones 10, 12 in the vertical direction over the entire length of the regions 10, 12. For the same reason, a readily electrically conductive region 84 is introduced into the source zone 20 illustrated by dashed lines in FIG. 4, which region is connected at the top to a contact layer 86 for applying a source potential. The contact layer 86 is insulated from the front side 2 of the semiconductor body by an insulation layer 95.

I claim:

1. A semiconductor configuration, comprising:

a semiconductor body including a first connection zone of a first conductivity type, a second connection zone of the first conductivity type, a channel zone of the first conductivity type, at least one control electrode, and an insulation layer;

said channel zone of the first conductivity type being formed between said first connection zone and said second connection zone;

said insulation layer surrounding said at least one control electrode;

said at least one control electrode extending, adjacent to said channel zone, from said first connection zone to said second connection zone;

said semiconductor body defining a vertical direction and a first lateral direction extending from said first connection zone to said second connection zone and a second lateral direction transverse to the first lateral direction;

said first connection zone, said second connection zone and said at least one control electrode extending in the vertical direction such that, when a voltage is applied between said first and second connection zones, a current path along the lateral direction is formed in the channel zone;

said at least one control electrode being a substantially plate-shaped control electrode having a respective longitudinal extent in the vertical direction and in the first lateral direction and a lateral extent in the second lateral direction; and said respective longitudinal extent being greater than said lateral extent.

2. A semiconductor configuration, comprising:

a semiconductor body including a first connection zone of a first conductivity type, a second connection zone of the first conductivity type, a channel zone of the first conductivity type, at least one control electrode, and an insulation layer, said first connection zone having a first zone with a first dopant concentration and a second zone with a second dopant concentration, said first dopant concentration being higher than said second dopant concentration, and said second zone being formed between said first zone and said channel zone;

said channel zone of the first conductivity type being formed between said first connection zone and said second connection zone;

said insulation layer surrounding said at least one control electrode;

said at least one control electrode extending, adjacent to said channel zone, from said first connection zone to said second connection zone;

said semiconductor body defining a vertical direction and a lateral direction; and said first connection zone, said second connection zone and said at least one control electrode extending in the vertical direction such that, when a voltage is applied between said first and second connection zones, a current path along the lateral direction is formed in the channel zone.

3. A semiconductor configuration, comprising:

a semiconductor body including a first connection zone of a first conductivity type, a second connection zone of the first conductivity type, a channel zone of the first conductivity type, at least one control electrode, and an insulation layer, said first connection zone having a first zone with a first dopant concentration and a second zone with a second dopant concentration, and said second zone completely surrounding said first zone in the lateral direction;

said channel zone of the first conductivity type being formed between said first connection zone and said second connection zone;

said insulation layer surrounding said at least one control electrode;

said at least one control electrode extending, adjacent to said channel zone, from said first connection zone to said second connection zone;

said semiconductor body defining a vertical direction and a lateral direction; and said first connection zone, said second connection zone and said at least one control electrode extending in the vertical direction such that, when a voltage is applied between said first and second connection zones, a current path along the lateral direction is formed in the channel zone.

4. A semiconductor configuration, comprising:

a semiconductor body including a first connection zone of a first conductivity type, a second connection zone of the first conductivity type, a channel zone of the first conductivity type, at least one control electrode, and an insulation layer;

said channel zone of the first conductivity type being formed between said first connection zone and said second connection zone;

said insulation layer surrounding said at least one control electrode;

said at least one control electrode extending, adjacent to said channel zone, from said first connection zone to said second connection zone;

said semiconductor body defining a vertical direction and a lateral direction;

said first connection zone, said second connection zone and said at least one control electrode extending in the vertical direction such that, when a voltage is applied between said first and second connection zones, a current path along the lateral direction is formed in the channel zone;

said first connection zone having a first zone with a first dopant concentration and a second zone with a second dopant concentration;

said second connection zone having a third dopant concentration;

said channel zone having a fourth dopant concentration; and said fourth dopant concentration being lower than said first and third dopant concentrations.

5. A semiconductor configuration, comprising:

a semiconductor body including a first connection zone of a first conductivity type, a second connection zone of the first conductivity type, a channel zone of the first conductivity type, at least one control electrode, and an insulation layer;

said channel zone of the first conductivity type being formed between said first connection zone and said second connection zone;

said insulation layer surrounding said at lease one control electrode;

said at least one control electrode extending, adjacent to said channel zone, from said first connection zone to said second connection zone;

said semiconductor body defining a vertical direction and a lateral direction;

said first connection zone, said second connection zone and said at least one control electrode extending in the vertical direction such that, when a voltage is applied between said first and second connection zones, a current path along the lateral direction is formed in the channel zone;

said semiconductor body having a rear side;

a layer of the first conductivity type being disposed at said rear side;

said first connection zone having a first zone with a first dopant concentration and a second zone with a second dopant concentration;

said layer having a third dopant concentration;

said third dopant concentration substantially corresponding to said first dopant concentration; and said layer being connected to said first connection zone.

6. A semiconductor configuration, comprising:

a semiconductor body including a first connection zone of a first conductivity type, a second connection zone of the first conductivity type, a channel zone of the first conductivity type, at least one control electrode, an insulation layer, a further first connection zone, and a further channel zone extending between said further first connection zone and said second connection zone;

said channel zone of the first conductivity type being formed between said first connection zone and said second connection zone;

said insulation layer surrounding said at least one control electrode;

said at least one control electrode extending, adjacent to said channel zone, from said first connection zone to said second connection zone;

said semiconductor body defining a vertical direction and a lateral direction;

said first connection zone, said second connection zone and said at least one control electrode extending in the vertical direction such that, when a voltage is applied between said first and second connection zones, a current path along the lateral direction is formed in the channel zone; and said at least one control electrode extending, adjacent to said second connection zone, said channel zone and said further channel zone, from said first connection zone to said further first connection zone.

7. A semiconductor configuration, comprising:

a semiconductor body including a first connection zone of a first conductivity type, a second connection zone of the first conductivity type, a channel zone of the first conductivity type, at least one control electrode, and an insulation layer;

said channel zone of the first conductivity type being formed between said first connection zone and said second connection zone;

said insulation layer surrounding said at least one control electrode;

said at least one control electrode extending, adjacent to said channel zone, from said first connection zone to said second connection zone;

said semiconductor body defining a vertical direction and a lateral direction;

said first connection zone, said second connection zone and said at least one control electrode extending in the vertical direction such that, when a voltage is applied between said first and second connection zones, a current path along the lateral direction is formed in the channel zone;

said semiconductor body having a front side and a rear side; and said first connection zone extending, in the vertical direction, from said front side to said rear side of said semiconductor body.

8. A semiconductor configuration, comprising:

a semiconductor body including a first connection zone of a first conductivity type, a second connection zone of the first conductivity type, a channel zone of the first conductivity type, at least one control electrode, and an insulation layer;

said channel zone of the first conductivity type being formed between said first connection zone and said second connection zone;

said insulation layer surrounding said at least one control electrode;

said at least one control electrode extending, adjacent to said channel zone, from said first connection zone to said second connection zone;

said semiconductor body defining a vertical direction and a lateral direction;

said first connection zone, said second connection zone and said at least one control electrode extending in the vertical direction such that, when a voltage is applied between said first and second connection zones, a current path along the lateral direction is formed in the channel zone; and said semiconductor body having a rear side; and an electrically conductive layer disposed on said rear side of said semiconductor body for making contact with said first connection zone.

9. A semiconductor configuration, comprising:

a semiconductor body including a first connection zone of a first conductivity type, a second connection zone of the first conductivity type, a channel zone of the first conductivity type, at least one control electrode, an insulation layer, and an electrically conductive zone introduced in said first connection zone for making contact with said first connection zone;

said channel zone of the first conductivity type being formed between said first connection zone and said second connection zone;

said insulation layer surrounding said at least one control electrode;

said at least one control electrode extending, adjacent to said channel zone, from said first connection zone to said second connection zone;

said semiconductor body defining a vertical direction and a lateral direction; and said first connection zone, said second connection zone and said at least one control electrode extending in the vertical direction such that, when a voltage is applied between said first and second connection zones, a current path along the lateral direction is formed in the channel zone.

10. The semiconductor configuration according to claim 9, wherein said electrically conductive zone is formed of a material selected from the group consisting of polysilicon and a metal.

11. A semiconductor configuration, comprising:

a semiconductor body including a first connection zone of a first conductivity type, a second connection zone of the first conductivity type, a channel zone of the first conductivity type, at least one control electrode, an insulation layer, and an electrically conductive zone introduced in said second connection zone for making contact with said second connection zone;

said channel zone of the first conductivity type being formed between said first connection zone and said second connection zone;

said insulation layer surrounding said at least one control electrode;

said at least one control electrode extending, adjacent to said channel zone, from said first connection zone to said second connection zone;

said semiconductor body defining a vertical direction and a lateral direction; and said first connection zone, said second connection zone and said at least one control electrode extending in the vertical direction such that, when a voltage is applied between said first and second Connection zones, a current path along the lateral direction is formed in the channel zone.

12. The semiconductor configuration according to claim 11, wherein said electrically conductive zone is formed of a material selected from the group consisting of polysilicon and a metal.

13. The semiconductor configuration according to claim 2, wherein said first dopant concentration is higher than $10^{18}$ cm$^{-3}$.

14. The semiconductor configuration according to claim 2, wherein said second dopant concentration is substantially $5\times10^{15}$ cm$^{-3}$.

15. The semiconductor configuration according to claim 4, wherein said fourth dopant concentration is less than $10^{14}$ cm$^{-3}$.

* * * * *